(12) United States Patent
Hu et al.

(10) Patent No.: US 6,627,947 B1
(45) Date of Patent: Sep. 30, 2003

(54) COMPACT SINGLE-POLY TWO TRANSISTOR EEPROM CELL

(75) Inventors: Yongzhong Hu, San Jose, CA (US); Jein Chen Young, Milpitas, CA (US); Stewart Logie, Campbell, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 53 days.

(21) Appl. No.: 09/643,279

(22) Filed: Aug. 22, 2000

(51) Int. Cl.[7] .................................... H01L 29/788
(52) U.S. Cl. .............. 257/318; 365/185.05; 365/185.18
(58) Field of Search ................... 257/314–326; 438/257–267; 365/185.01–185.33

(56) References Cited

U.S. PATENT DOCUMENTS

| 4,924,278 A | | 5/1990 | Logie ..................... 357/23.5 |
| 5,594,687 A | * | 1/1997 | Lin ......................... 365/185.1 |
| 5,969,992 A | * | 10/1999 | Mehta ................... 365/185.26 |
| 5,999,449 A | * | 12/1999 | Mehta ................... 365/185.05 |

FOREIGN PATENT DOCUMENTS

| JP | 63-58959 | * | 3/1988 | ................. 257/310 |

* cited by examiner

Primary Examiner—Wael Fahmy, Jr.
Assistant Examiner—Maroos D. Pizarro-Crespo
(74) Attorney, Agent, or Firm—Fliesler Dubb Meyer and Lovejoy LLP

(57) ABSTRACT

A non-volatile memory cell at least partially formed in a semiconductor substrate. The cell comprises a first transistor comprising a high voltage NMOS transistor having a first active region and a second active region; a second transistor sharing said second active region and having a third active region in said substrate; an active control gate region formed in said substrate; a polysilicon layer having a first portion forming a gate for said first transistor, and a second portion forming gate for said second transistor and a floating gate overlying said active control gate region. In one embodiment, an oxynitride separates said second portion and said active control gate region.

6 Claims, 3 Drawing Sheets

COMPACT SINGLE-POLY TWO TRANSISTOR EEPROM CELL

BACKGROUND OF THE INVENTION

1. Field of the Invention

This invention relates generally to semiconductor devices, and more particularly, to electrically erasable programmable read only memory ("EEPROM") cells.

2. Description of Related Art

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. Generally, arrays of individual memory cells are formed on a single substrate and combined with sense and read circuitry, and connected by row-wise and column-wise conductive regions or metallic conductors to allow for array wide bulk program and erase as well as selected bit programming.

The trend in construction of Electrically Erasable Programmable Read Only Memory (EEPROM) cells follows the general trend of semiconductor process technology in the move toward defining smaller device features. Conventional EEPROMs used "stacked gate" (or dual-poly) cells, wherein multiple applications of polysilicon formation were required to build cell structures. Recently, the conventional "stacked gate" EEPROM structure has given way to different cell designs and array architectures, all intended to increase density and reliability in the resulting circuit. In addition, in EEPROM devices used for programmable logic devices, designers strive to reduce power requirements of devices by reducing program and erase voltage requirements.

Conventionally, programmable logic EEPROMS were typically formed by stacked gate devices operating utilizing Fowler-Nordheim tunneling to program and erase the floating gate. Later, in an effort to improve process times and efficiency, single-layer polysilicon-based cells such as that set forth in U.S. Pat. No. 4,924,278, a schematic of which is shown in FIG. 1, were developed.

An EEPROM cell is typically made up of three separate transistors, namely, a write transistor, a sense transistor and a read transistor. The EEPROM cell is able to be programmed and erased by removing or adding electrons to a floating gate. Thus, in one example, the floating gate is programmed by removing free electrons from the floating gate and thereby giving the floating gate a positive charge. When it is desired to erase the EEPROM cell in this example, the floating gate is given a net negative charge by injecting electrons onto the floating gate. The read operation is performed by reading the state (current) of the sense transistor. In order to give the floating gate a positive charge (program) or negative charge (erase), electron tunneling, for example using the well-known Fowler-Nordheim tunneling technique, may be performed by applying the appropriate voltage potentials between the floating gate and a region, such as a drain region, of a transistor. Upon applying the appropriate voltage potentials, electron tunneling occurs through a tunnel oxide layer between the floating gate and the region.

As the feature sizes of EEPROM cells are scaled downward, the three-transistor EEPROM cells exhibit certain scaleablity, cost and reliability limitations. First, since three transistors (write, sense and read) form the typical EEPROM cell, the size of the EEPROM cell is large. Also, with a three-transistor cell, three oxide layers are needed that may vary in thicknesses requiring complex process steps to form the three tunnel oxide layers of varying thicknesses. Second, the manufacturing process for a smaller EEPROM cell becomes more complex and, accordingly, manufacturing costs rise as transistor channel lengths are reduced. For example, as the channel length of a transistor of the EEPROM cell is scaled downward, the thickness of the gate oxide overlying the channel must also be reduced since the gate oxide thickness must be scaled with the channel length. In view of the fact that EEPROM cells already have a complex process to form multiple oxide thicknesses, additional oxide thicknesses for the transistors would add additional steps to further complicate the manufacturing process and thereby increase manufacturing costs.

FIG. 1 shows a schematic diagram of one embodiment of the EEPROM structure shown in the '278 patent. The EEPROM structure disclosed therein utilizes a single layer of polycrystalline silicon and a control gate formed in the silicon substrate to eliminate the need to form a separate control gate and floating gate in two layers of polysilicon. The EEPROM structure is made up of three separate NMOS transistors: a write transistor, a read transistor, and a sense transistor. In order to "program" the floating gate, a net positive charge is placed on the gate by removing free electrons from the floating gate. Likewise, to erase the floating gate, the floating gate is given a net negative charge by injecting electrons onto the floating gate.

An exemplary method of programming, erasing and writing to the cell in FIG. 1 is given by Table 1:

TABLE 1

| | WL | BL | PT | PTG | Substrate | ACG |
|---|---|---|---|---|---|---|
| Read | $V_{cc}$ | ground | $V_{sense}$ | ground | ground | 0 |
| Program | $V_{pp}+$ | $V_{pp}$ | ground | ground | ground | 0 |
| Erase | $V_{cc}$ | ground | float | $V_{pp}$ | ground | $V_{pp}+$ |

This EEPROM structure has been well exploited in commercial devices. Nevertheless, as process technologies and practical considerations drive designers toward higher performance, alternative designs are investigated. The aforementioned cell structure requires, in a number of embodiments, a minimum oxide thickness of about 90–100 Å for the program junction oxide region due to the presence of the relatively high electric field across the oxide during the life of the cell. In order to accomplish scaling of the device, it would be desirable to provide a design wherein such region could be scaled without performance loss.

FIG. 2 shows an alternative single poly EEPROM cell wherein the cell designers strove to achieve a two-transistor cell. Nevertheless, a separate tunnel path, shown as a diode in FIG. 2, is required to remove electrons from the floating gate of the cell. This additional tunnel diode increases the overall size of the cell.

SUMMARY OF THE INVENTION

The invention, roughly described, comprises a non-volatile memory cell at least partially formed in a semiconductor substrate, comprising: a first transistor comprising a high voltage NMOS transistor having a first active region and a second active region; a second transistor sharing said second active region and having a third active region in said substrate; an active control gate region formed in said substrate; a polysilicon layer having a first portion forming a gate for said first transistor, and a second portion forming gate for said second transistor and a floating gate overlying said active control gate region. In one embodiment, an oxynitride separates said second portion and said active control gate region.

In a further embodiment, the invention comprises a memory cell comprising: a first transistor having a gate coupled to a word line and a first active region in said substrate coupled to product term ground; a second transistor having a common floating gate, a second active region coupled to said first transistor and a third active region coupled to a product term voltage; an array control gate region in said substrate and capacitively coupled to said common floating gate via an oxynitride layer.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

Figure 1:
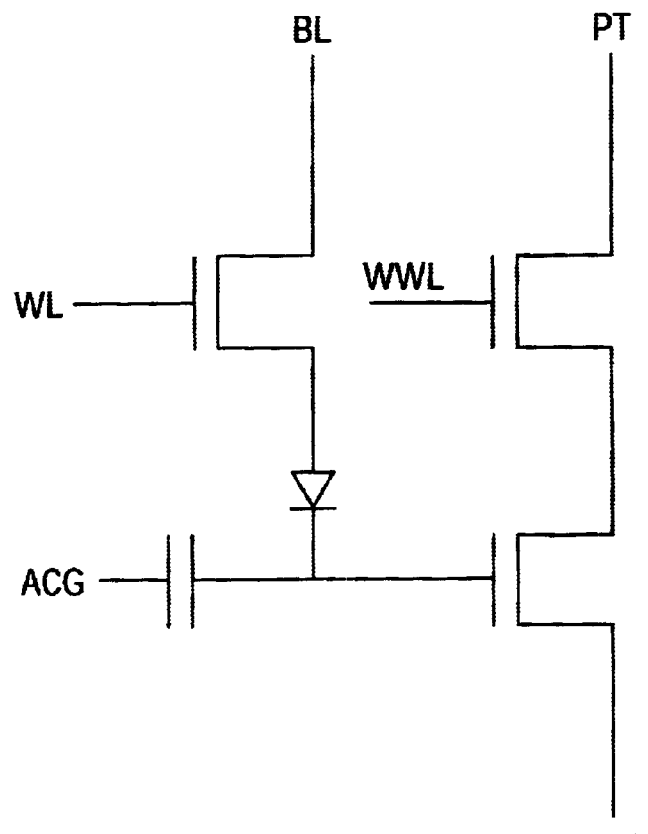
FIG. 1 is a schematic diagram of a first single poly EEPROM cell of the prior art.
Figure 2:
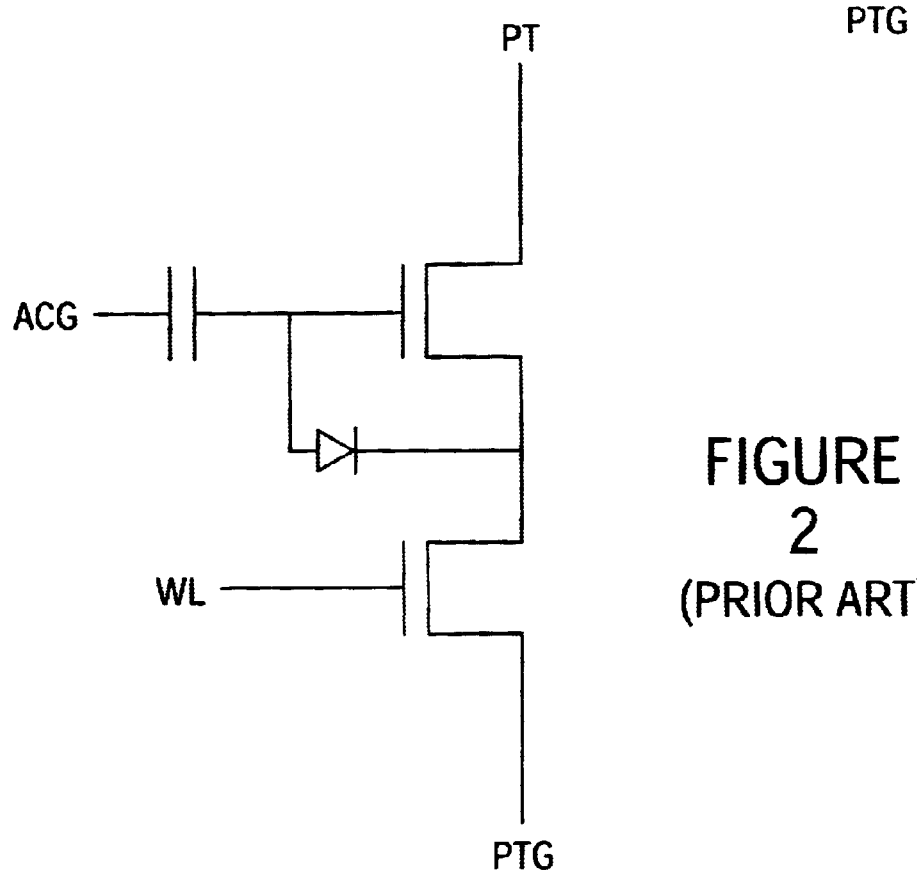
FIG. 2 is a second schematic diagram of a second single poly EEPROM cell of the prior art.
Figure 3:
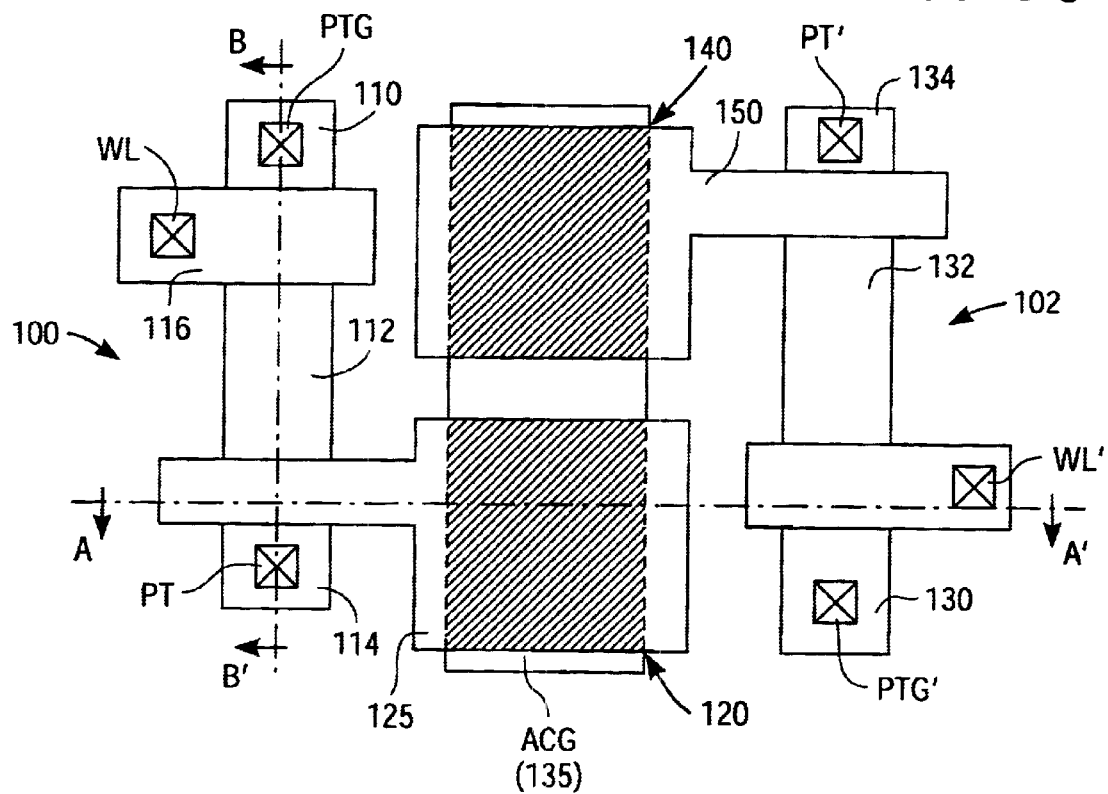
FIG. 3 is a plan view of two EEPROM cells manufactured in accordance with the present invention.
Figure 4:
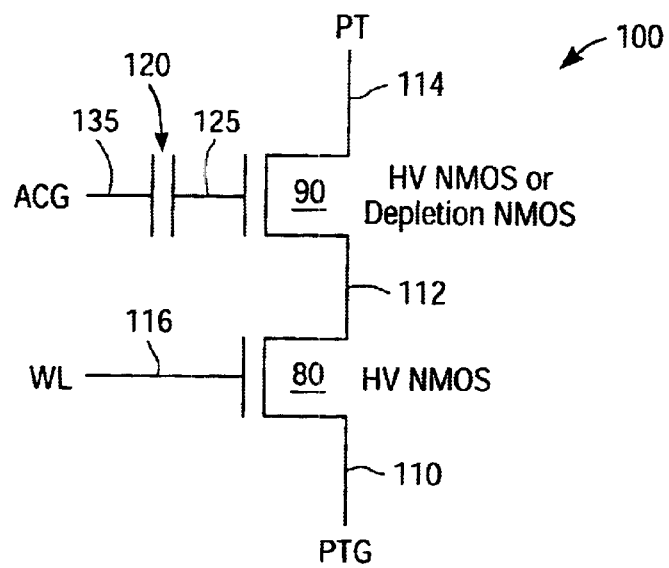
FIG. 4 is a schematic diagram of one of the two cells shown in FIG. 3.

FIGS. 3–5 show a two-transistor EEPROM cell and a method for making a cell which provides a more efficient and smaller EEPROM cell than that currently known. The cell uses an oxynitride layer overlying the array control gate region in the substrate coupled with a full channel erase, edge programming scheme to achieve a smaller cell which embodies consistent performance objectives of cell designers in a single-poly embodiment.

FIG. 3 shows a plan view and FIG. 4 a schematic view of the EPROM cell of the present invention. FIG. 3 shows two EPROM cells constructed in a side-by-side arrangement to illustrate the compactness and sizing advantage provided by the cell of the present invention.

An EEPROM cell 100 is shown in FIGS. 3 and 4 along with a companion cell 102. As shown in FIGS. 3 and 4, cell 100 comprises a write transistor 90, a control transistor 80, a floating gate 125 and various control voltages (PT, ACG, WL, PTG) coupled to doped silicon regions or polysilicon regions. An array control gate (135) is formed as a region of impurity in the semiconductor substrate and capacitively coupled to the floating gate 125. Cell 100 shares the ACG with cell 102. In accordance with the invention and as hereafter described, capacitor 120 is formed by a region of oxynitride (ONO) between the array control gate region 135 and polysilicon layer 125 comprising the common floating gate and the gate of transistor 90. Since ONO has a higher dielectric constant than that of an oxide with the same thickness, it has a higher coupling ratio. Therefore, the ACG capacitor can be reduced in area, resulting in smaller overall EE cell size.

Transistor 90 includes a source region 114 and a drain region 112 which it shares as a source region with transistor 80. Transistor 80 also includes a drain region 110 coupled to the product term ground (PTG) control voltage. Source region 114 is coupled to the product term control voltage PT.

Wordline control voltage (WL) is coupled to polysilicon region 116 which serves as the gate for transistor 80. The gate of transistor 90 comprises a portion of common floating gate 125 formed by the same layer of polysilicon used to form gate 116, as described below. A second transistor 102 may be advantageously formed in a mirror configuration with a floating gate 150 overlying array control gate 135 and having a portion extending over active regions 132 and 134 forming a right transistor for a second cell 102.

In operation, voltages as exemplified in Table 2 may be applied to the respective terminals for the cell to erase, program, and read, accordingly:

TABLE 2

|  | PTG | WL | ACG | PT |
|---|---|---|---|---|
| Erase (charge) | 0 | $V_{cc}$ | $V_{pp}$ | float |
| Program (discharge) | $V_{pp}$ | $V_{pp}+$ | 0 | float |
| Read | $V_{read}$ | $V_{cc}$ | 0 | 0 | where typical values for $V_{cc}$, $V_{pp}$ $V_{read}$ and $V_{pp}+$ are:

$V_{cc}$=1.8V (1.5~2V)

$V_{pp}$=11V (10–13V)

$V_{pp}+$=12V (11.5~12.5V)

$V_{read}$=1.4V (1.0~1.5V)

In general, transistors 80 and 90 comprise high-voltage NMOS transistors and transistor 90 may optionally comprise a high-voltage NMOS depletion transistor, which increases cell read current in programmed states at the same floating gate potential.

FIGS. 5A–5F show two cross-sections A–A' and B–B' of the cell of FIG. 3 illustrating a unique portion of the sequence of manufacturing for the EEPROM cell of the present invention.

It should be understood by one of average skill in the art that the steps illustrated in FIGS. 5A–5F are exemplary only and constitute only a portion of the manufacturing process for an integrated circuit device incorporating the cell of the present invention. In particular, periphery transistors utilized to control, for example, the product term ground (PTG), wordline (WL) and ACG voltages are formed in additional process steps not herein described but which are readily apparent and known to one of average skill in the art. In addition, it should be understood that a plurality of like cells 100,102 are arranged in arrays with row and columnar connectors. It should be further understood that any number of cleaning steps may be utilized at various points in the following description.

Figure 5A:
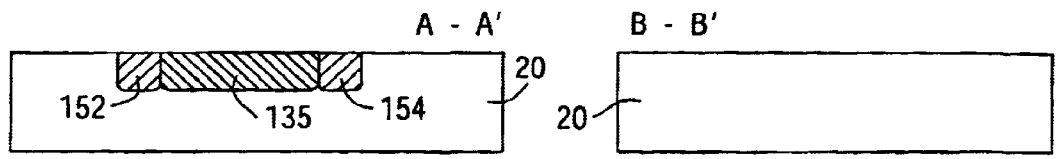
FIGS. 5A–5F are cross-sections of long lines A–A' and B–B', respectively, of FIG. 3 showing a portion of the manufacturing process utilized to manufacture the cell of the present invention.

FIG. 5A shows a substrate 20 which includes two isolation regions 152,154 which are formed by conventional trench isolation techniques. Isolation regions 152,154 isolate the ACG 135 from the remainder of the transistors utilized in the cell. It should be recognized that the form of isolation regions 152,154 is not specific to the principles of the invention, and alternative forms of device isolation, such as LOCOS, shallow trench isolation, deep trench isolation, and the like, may be used in accordance with the present invention.

Substrate 20 may, in one embodiment, comprise a silicon substrate having a conductivity type of, for example, a P-type conductivity. In one embodiment, the semiconductor substrate is a bulk substrate being entirely formed of P-conductivity type material. In alternative embodiments, the semiconductor substrate may be formed of a P-type conductivity material having an epitaxial layer on the top surface where the epitaxial layer is formed of a P-type conductivity material. P- and N-type conductivity materials (known as dopants) are materials commonly known in the art to alter the conductivity of semiconductor material by contributing either a hole (P-type) or an electron (N-type) to the conduction process. For silicon substrates, the dopants are generally found in groups 3 and 5 of the well-known chemical periodic table. In additional alternative embodiments, substrate 20 may be alternative silicon materials well known in the semiconductor industry including, but not limited to, germanium, germanium silicon, gallium arsenide, polysilicon, silicon-on-insulator, or the like.

Region 135 is formed by implanting an N-type dopant such as arsenic or phosphorous through any of a number of well-known processes. Region 135 may have a doping concentration of approximately $1 \times 10^{15}$ cm$^{-2}$ and will come to constitute the ACG region of the transistor of the present invention.

Figure 5B:
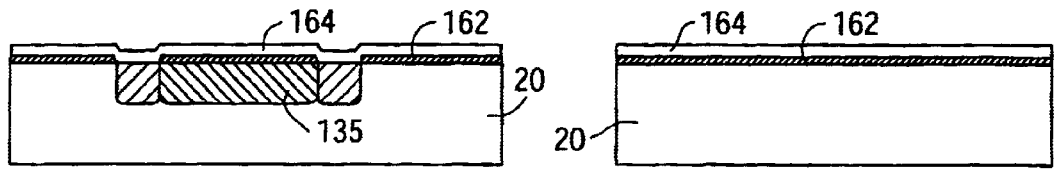

FIG. 5B shows the deposition of an oxide layer 162 on the surface of semiconductor substrate 20. Oxide layer 162 may be formed by immersing substrate 20 in an oxygen atmosphere and heating the substrate to grow a thermal oxide of a thickness of approximately 20 Å across the whole wafer. Following formation of oxide 162, a nitride layer 164 may be deposited on oxide 162 to a thickness of approximately 60–80 Å. Nitride layer 164 may be deposited by any of a number of known deposition techniques including sputtering or low pressure chemical vapor deposition (LPCVD).

Figure 5C:
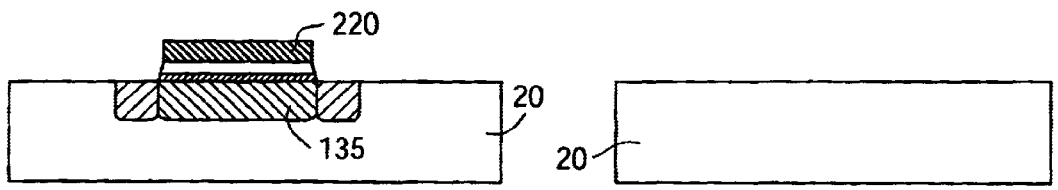

Following this deposition step, as shown in FIG. 5C, a photoresist mask layer (not shown) is applied across the surface of nitride layer 164 and patterned using an oxynitnde mask (not shown) leaving mask portion 220. The oxynitride layer (not shown) remains on the photoresist as the nitride etch is performed to remove all the nitride except that underlying region 220 of photoresist layer and oxynitride mask layer. The nitride etch stops on the first layer of oxide 162, leaving a residual oxide thickness of about 10 Å. Next, the photoresist is stripped and cleaned and a new residual oxide remaining on the surface of the substrate 20 is removed by a an HF or BOE wet etch.

Figure 5D:
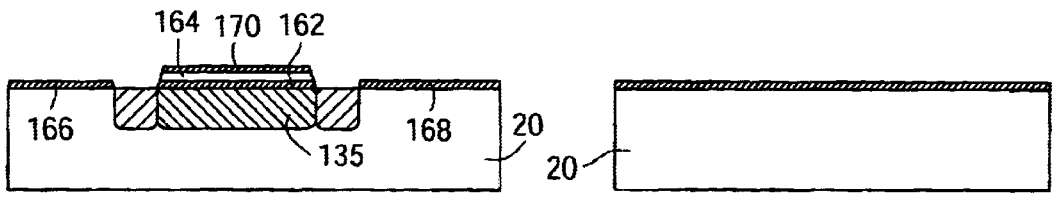

As shown in FIG. 5D, following removal of photoresist layer, an additional oxide layer is formed on the surface of substrate 20 by a thermal oxidation step in order to form gate oxides 166, 168 for transistors 80,90. This results in oxidation of nitride 1,64 to a thickness of 5–10 Å to form the final layer 170 of the ONO stack which underlies the floating gate region over ACG 135 and acts as capacitor 120 in accordance with the present invention. Gate oxide layer 166 has a thickness of about 90 Å on the surface of the substrate 20.

Figure 5E:
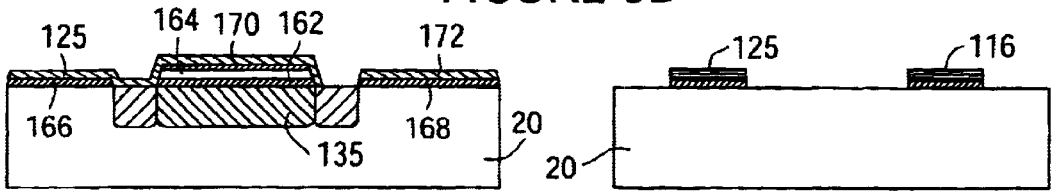
Figure 5F:
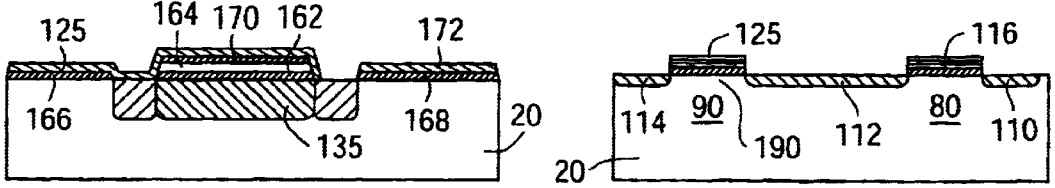

Layers 166, 168 and 170 are then covered with a single layer of polysilicon, which is masked and etched in accordance with known techniques as described above, to form the common gate 125 and gates 172 and 116, as shown in FIG. 5E, thereby completing formation of the cells 100, 102. The active regions 114, 112, and 110 are implanted by, for example, implanting an impurity such as arsenic or phosphorous to a concentration of $4 \times 10_{13}$ cm$^{-2}$ using a photolithographic implant mask. It should be recognized that additional steps may be utilized to form LDD regions adjacent to poly gates 125 and 172 if desired, in accordance with well-known techniques.

In order to erase EEPROM cell 100, floating gate 125 is given a negative charge by moving electrons to the floating gate 125. The method of moving electrons to the floating gate 125 is commonly known to those skilled in the art as Fowler-Nordheim tunneling. In general, this process has electrons tunnel through a barrier, for example, a thin oxide layer, in the presence of a high electric field. However, unlike previous $E^2$ cells that performed electron tunneling through one oxide window at the edge of a drain region, the present invention provides for electron tunneling across the entire tunneling channel 190 to erase EEPROM cell 100 and the edge of oxide 166 between gate 125 and region 112 to program the EEPROM cell 100.

It should be understood that the entire portion of tunneling channel 190 means the portion of the substrate between implant regions 114 and 112 underlying oxide layer 166. In order to move electrons to floating gate 125 to erase EEPROM cell 100, a voltage $V_{pp}$, for example 11 volts, is applied to ACG, the product term (PT) is allowed to float, the wordline (WL) is provided by the voltage $V_{cc}$ of approximately 1.8V, and the product term ground (PTG) is grounded. Since the gate 116 is set at a high voltage ($V_{cc}$) and the drain 110 is grounded, and transistor 80 is "on," a potential is created between floating gate 125 via ACG and channel 90. The tunnel oxide layer 166 immediately above the channel 190 has a thickness so that electron tunneling occurs across the entire portion of tunneling channel 190 and through tunnel oxide layer 166, since the programming voltages previously described provide a sufficient voltage potential between floating gate 125 and channel 190. The voltages provided in this embodiment may vary in alternative embodiments as long as a sufficient potential is created to move electrons through the tunnel oxide layer 166 onto floating gate 125 across tunneling channel 190. The oxide thicknesses of layer 166 may vary as long as the thickness is sufficient to permit electron tunneling at the disclosed potentials.

To program floating gate 125, in the same embodiment, electrons are removed from floating gate 125 through oxide layer 166 at the edge between gate 125 and region 112. A voltage $V_{pp}$ of, for example, 11 volts, is provided to the product term ground PTG, while a higher voltage $V_{pp}$+ of, for example, 12V is applied to wordline WL of transistor 80. The ACG region is set at ground and the product term is allowed to float. Transistor 80 is turned on since the wordline voltage is high, which provides a relatively high voltage $V_{pp}$ to region 112, and with the ACG set at ground, the potential is created between the floating gate 125 and region 112 so that electrons tunnel from floating gate 125 into region 112 through the channel edge between region 125 and 112. In an array of cells of this type, the erase operation may be performed in bulk, while program operation can be done bit by bit selectively.

A read operation is performed by applying a $V_{cc}$ of 1.8V to wordline WL, applying a read potential voltage $V_{read}$ of 1.4V to the product term ground (PTG) and grounding the product term (PT) and ACG. The detection of a current at the PTG line will determine whether the device is programmed or not, depending on the state of the electrons or holes on floating gate 125.

EEPROM cell 100 has numerous advantages over previous EEPROM cells. First, ONO is used in the ACG capacitor 120 resulting in an improved coupling ratio for the floating gate due to the higher dielectric constant of ONO than the normally-used thermal oxide. This also provides increased program/erase efficiency. This single poly EEPROM cell eliminates the conventional tunnel window and has a simplified process flow as compared to the stacked gate EEPROM and therefore a reduced cost. A smaller area is used to achieve the same coupling ratio utilizing the oxynitride stack as opposed to standard oxide, since a higher dielectric concept for the ONO yields the same amount of capacitive coupling as the thicker 150 Å oxide normally required for such a device. Secondly, a depletion or non-depletion transistor for the floating gate region may be utilized in accordance with the present invention.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit and scope of the invention as disclosed herein and defined by the following claims.

What is claimed is:

1. A memory cell array, comprising:

an array control gate region;

a first two-transistor EEPROM programming cell comprising:

a first transistor having a first active region source coupled to a first product term ground voltage, a control gate coupled to a first word line voltage, and a second active region;

a second transistor sharing said second active region with said first transistor and including a third active region coupled to a first product term voltage;

a first common floating gate having a first portion overlying a channel between said second active region and said third active region, and a second portion overlying said array control gate region;

a second two-transistor EEPROM cell sharing said array control gate region and including:

a third transistor having a fourth active region coupled to a second product term ground voltage, a control gate coupled to a second word line voltage, and a fifth active region; and a fourth transistor sharing said fifth active region with said third transistor and further having a sixth active region coupled to a second product term voltage.

2. The memory cell array of claim 1, wherein:

said active regions comprise highly doped N-type impurity regions, and a channel region between two of said active regions comprises a P-type impurity substrate.

3. The memory cell array of claim 1, wherein:

said first common floating gate is coupled to a control gate voltage.

4. The memory cell array of claim 1, wherein:

said first product term ground voltage is coupled to ground, said first word line voltage is coupled to a voltage in the range of 1.5~2V, said first product term voltage is allowed to float, and said array control gate region is coupled to a voltage in the range of 10–13V.

5. The memory cell array of claim 1, wherein:

said first product term ground voltage is coupled to a voltage in the range of 10–13V, said first word line voltage is coupled to a voltage in the range of 11.5~12.5V, said array control gate region is coupled to ground, and said first product term voltage is allowed to float.

6. The memory cell array of claim 1, wherein:

said first product term voltage is coupled to ground, said first word line voltage is coupled to a voltage in the range of 1.5–2V, said array control gate region is coupled to ground, and said first product term ground voltage is coupled to a voltage in the range of 1.0~1.5V.

* * * * *